United States Patent
Akizuki et al.

(10) Patent No.: US 7,395,039 B2
(45) Date of Patent: Jul. 1, 2008

(54) TRANSMITTER

(75) Inventors: Taiji Akizuki, Sendai (JP); Mitsuru Tanabe, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 417 days.

(21) Appl. No.: 11/282,597

(22) Filed: Nov. 21, 2005

(65) Prior Publication Data

US 2006/0111057 A1    May 25, 2006

(30) Foreign Application Priority Data

Nov. 25, 2004 (JP) ............................. 2004-339817

(51) Int. Cl.
*H01Q 11/12* (2006.01)
*H03C 1/62* (2006.01)

(52) U.S. Cl. ................. 455/127.2; 455/115.3; 375/297; 375/300; 330/278

(58) Field of Classification Search .............. 455/67.11, 455/67.13, 91, 114.2, 114.3, 115.1, 115.3, 455/126, 127.1, 127.2, 522; 375/296, 297, 375/298, 300; 330/250, 277, 278
See application file for complete search history.

(56) References Cited

U.S. PATENT DOCUMENTS

| | | | |
|---|---|---|---|
| 5,251,330 A | | 10/1993 | Chiba et al. |
| 5,854,971 A | * | 12/1998 | Nagoya et al. ............... 455/126 |
| 7,116,946 B2 | * | 10/2006 | Tanabe et al. .................. 455/91 |
| 7,276,985 B2 | * | 10/2007 | Hirano ........................ 332/128 |
| 7,295,599 B1 | * | 11/2007 | Karsi ........................... 375/296 |
| 2005/0202789 A1 | * | 9/2005 | Tanabe et al. ............... 455/110 |

* cited by examiner

*Primary Examiner*—Quochien B Vuong
(74) *Attorney, Agent, or Firm*—Dickinson Wright, PLLC

(57) ABSTRACT

In a transmitter of the present invention, a modulated signal is separated into an amplitude component and a phase component which are inputted to a radio-frequency modulated signal input terminal and a supply voltage terminal of a radio-frequency power amplifier. A voltage adjustment circuit is provided between an output terminal of the radio-frequency power amplifier and an amplitude amplification circuit having a feedback circuit. The voltage adjustment circuit changes the amount of isolation in accordance with the voltage level of the amplitude component. By this, the amplitude component of the radio-frequency modulated wave attenuates the level inputted to the feedback circuit of the amplitude amplification circuit through the supply voltage terminal of the radio-frequency power amplifier.

10 Claims, 10 Drawing Sheets

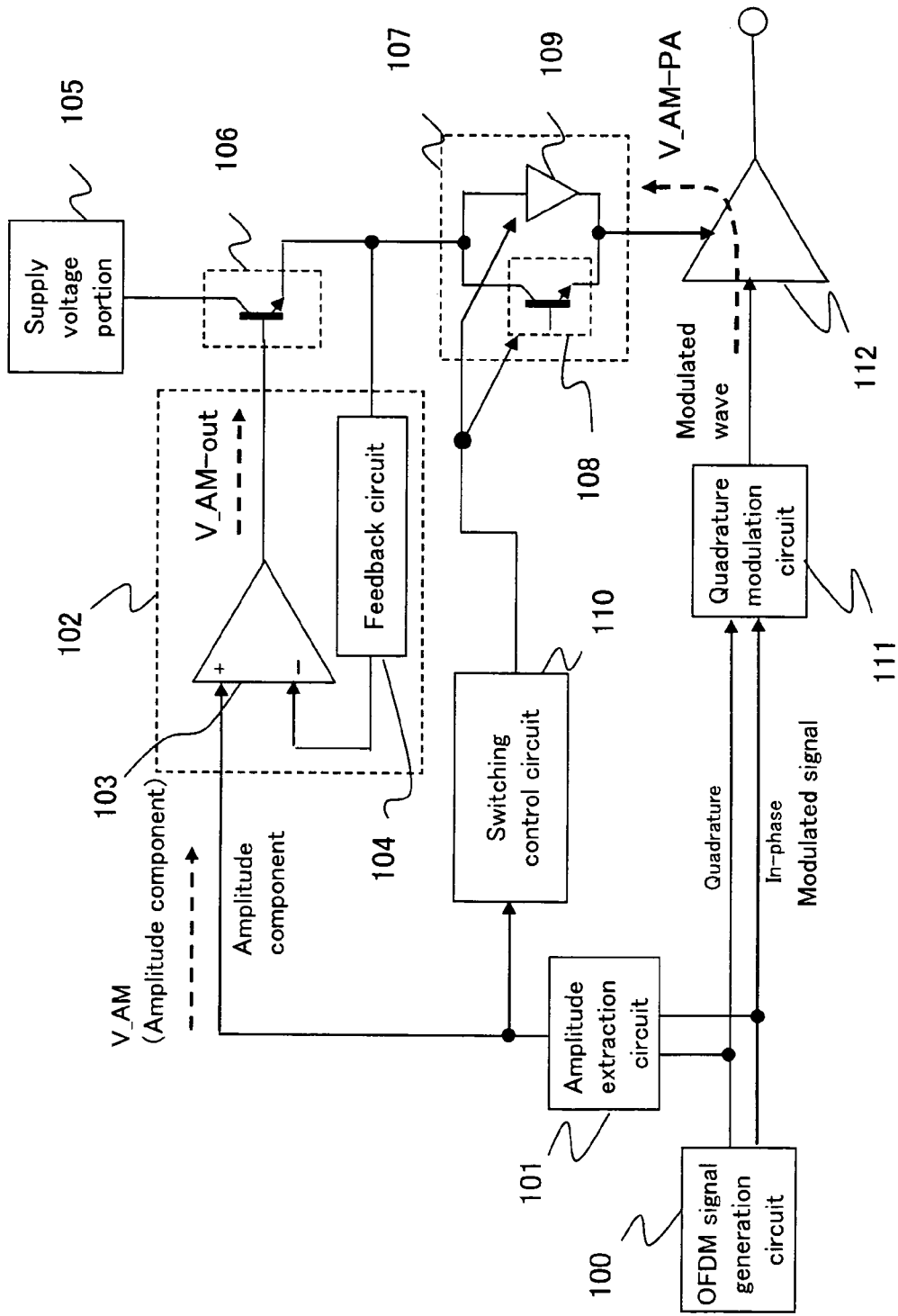

TRANSMITTER

BACKGROUND OF THE INVENTION

1. Field of the Invention

The present invention relates to a radio transmitter used for communication methods using subcarriers such as the OFDM (orthogonal frequency division multiplex).

2. Prior Art

Generally, for modulated signals involving amplitude modulation, in particular, modulated signals involving multilevel modulation such as QAM (quadrature amplitude modulation), a linear operation is required of the radio-frequency power amplifier for transmitting power to the antenna. For this reason, as the operation class of the radio-frequency power amplifier, Class A and Class AB have been used.

However, with the migration to broadband communications, communication methods using subcarriers such as the OFDM have come to be used, and high efficiency cannot be expected of the conventional Class-A and Class-AB radio-frequency power amplifiers. That is, in the OFDM, high power is instantaneously generated in a completely random fashion by superimposing subcarriers on one another. That is, the ratio between the average power and the instantaneous peak power, PAPR (peak to average power ratio), is high. For this reason, it is necessary to always hold high DC power so that the instantaneous peak power can also be linearly amplified. In the Class-A operation, the power supply efficiency is only 50% at the most; in particular, in the case of the OFDM, the power supply efficiency is as low as approximately 10% since the PAPR is high.

Consequently, for example, in portable radios using batteries as the power source, the continuous usable time is short, which is inadequate for practical use.

To solve such a problem, a conventional EER (envelope elimination and restoration) method known as Khan's method has been proposed (see, for example, Patent Document 1).

FIG. 8 is a block diagram showing the EER method in outline. In FIG. 8, a modulated signal, for example a QAM signal, outputted from an OFDM signal generation circuit 100 as modulated signal generating means is divided into two branches. On one branch, the modulated signal is upconverted by a quadrature modulation circuit 111, and inputted as a radio-frequency modulated wave to a radio-frequency modulated signal input terminal of a radio-frequency power amplifier 112 comprising a saturated amplifier. On the other branch, the modulated signal is converted to an amplitude component by an amplitude extraction circuit 101, amplified to a desired amplitude component voltage level by an operational amplifier 103, and inputted to an emitter follower 106 as voltage converting means. The emitter follower 106 supplies the current required by the radio-frequency power amplifier 112 to the supply voltage terminal of the radio-frequency power amplifier 112 together with the amplitude component. In FIG. 8, reference numeral 102 represents an amplitude amplification circuit as amplitude amplifying means, reference numeral 104 represent a feedback circuit, and reference numeral 105 represents a supply voltage portion.

When a radio-frequency modulated wave which is an input signal is amplified by the radio-frequency power amplifier 112 comprising a saturated amplifier, the amplitude component of the radio-frequency modulated wave is temporarily lost in the process. However, when the supply voltage of the radio-frequency power amplifier 112 is controlled in proportion to the amplitude component of the radio-frequency modulated wave which is the input signal, the amplitude component of the radio-frequency modulated wave is inputted from the supply voltage portion 105 to the supply voltage terminal of the radio-frequency power amplifier 112. As a result, a radio-frequency modulated wave containing the original amplitude component which radio-frequency modulated wave is restored at the radio-frequency power amplifier 112 is outputted.

The provision of this structure enables the radio-frequency power amplifier to operate in a highly efficient saturated condition even when the amplitude component of the modulated signal is changed, so that the efficiency of the radio-frequency power amplifier 112 can be enhanced.

Here, when the radio-frequency power amplifier comprises, for example, a field-effect transistor, the saturated amplifier refers to a Class-F amplifier where harmonic control is performed so that the drain voltage waveform is rectangular, or a Class-E or a Class-D amplifier where the load condition is optimized so that the drain voltage waveform and the drain current waveform do not overlap each other. In this saturated amplifier, since the period during which the drain current and the drain voltage are simultaneously generated is minimized as a characteristic thereof, power consumption can be suppressed.

For example, when a supply current and a supply voltage of 200 mA and 3V are supplied, the DC power is 600 mW. However, in the saturated amplifier as the radio-frequency power amplifier 112, no current flows when the field-effect transistor is off, and only the supply voltage is applied. Consequently, the DC power consumption is 0. On the other hand, although a current of 200 mA flows when the field-effect transistor is on, since the field-effect transistor is completely conducting, it can be assumed that the drain-source voltage VDS is a saturated voltage, that is, 0.3 V at the most. In this case, a DC power of 0.3 V×0.2 A=0.06 W, that is, 60 mW is consumed in the field-effect transistor. The power supply efficiency reaches as high as (600−60)/600=90%. This effect is significant because the power supply efficiency reaches only 50% at the most in the Class-A amplifier.

Generally, in transmitters using the EER method, unless the amplitude component and the phase component obtained from the output terminal of the radio-frequency power amplifier are precise reproductions of the phase component and the amplitude component of the original modulated signal, the original modulated signal (precisely, radio-frequency modulated wave since the original modulated signal is frequency-converted) cannot be reproduced. That is, the errors of the amplitude component and the phase component appear as a spectral distortion of the outputted radio-frequency modulated wave and degradation in modulation accuracy.

For this reason, in the EER method, it is necessary to output, from the modulated signal generator 100, a modulated signal having undergone an inverse correction processing to previously obtain the error function of the amplitude component and the phase component and multiply the amplitude component and the phase component by the inverse function of the error function.

Moreover, it is necessary for the transmission path of the amplitude component to have a closed loop structure having a feedback circuit so that the error component reaching the supply voltage terminal of the radio-frequency power amplifier is reduced.

When the saturated amplifier is used in a completely saturated region, the amount of fluctuations in the phase change with respect to the change in the amplitude component inputted to the supply voltage terminal of the radio-frequency power amplifier is increased, so that the arithmetic throughput of the inverse correction processing is increased. In addition, for example, when the characteristic of the radio-frequency power amplifier is changed due to fluctuations in temperature or power, since the amount of fluctuations in the error function is increased, a spectral distortion or degradation in modulation accuracy occurs in the radio-frequency modulated wave as a result.

For this reason, as the saturated amplifier characteristic to be used, a region that is not completely saturated, that is, a region close to the saturated region, for example, the 1-dB gain compression point is used.

Patent Document 1: U.S. Pat. No. 5,251,330A1

However, as the modulated signal, in a modulated signal with a high PAPR and high instantaneous peak power like that of the IEEE 802.11a/g standard which is a wireless LAN standard, there are cases where by the transmitter characteristic fluctuating, a time delay occurs between a first amplitude component outputted from the amplitude extraction circuit 101 and a second amplitude component of a radio-frequency modulated wave inputted to the radio-frequency modulated signal input terminal of the radio-frequency power amplifier 112, amplified and occurring at the output terminal of the radio-frequency power amplifier 112.

In this case, the following problem arises: When the occurring time delay is the allowable level of the inverse function of the amplitude component and the phase component, the distortion of the radio-frequency modulated wave never occurs. However, when the second amplitude component leaks to the feedback circuit 104 as shown in FIG. 8, the leakage component and the first amplitude component are superimposed on each other in the feedback circuit 104. This causes ringing due to a transient response, so that the amplitude component outputted from the amplitude amplification circuit 102 constituting the closed loop oscillates without converging. Consequently, the modulated waveform cannot be reproduced and a distortion occurs at the output terminal of the radio-frequency power amplifier 112, that is, the saturated amplifier.

Generally, as the modulated signal, in a modulated wave where the PAPR is high and the difference between the average power and the instantaneous peak power is large like that of the IEEE 802.11a/g standard which is a wireless LAN standard, in a linear amplifier where no amplitude component is required of the supply voltage of the radio-frequency power amplifier, a large capacitance can be set in the vicinity of the supply voltage terminal in order to suppress the modulated wave characteristic degradation due to supply voltage fluctuations.

However, in the EER method, it is necessary for the supply voltage terminal of the radio-frequency power amplifier to linearly transmit an amplitude component having a frequency component of, for example, approximately 40 MHz. For this reason, a capacitance having a high capacitance value cannot be set at the supply voltage terminal of the radio-frequency power amplifier. That is, the capacitance value of the capacitance stays at a value where at least a signal of 40 MHz can pass. Therefore, the error of the amplitude component is inputted to the supply voltage terminal of the radio-frequency power amplifier 112 without attenuated. In that case, a linear distortion such as a ripple occurs. This appears as a spectral distortion of the modulated wave and degradation in modulation accuracy as a result.

SUMMARY OF THE INVENTION

Accordingly, an object of the present invention is to provide a transmitter capable of realizing a highly efficient EER method where no distortion occurs in the output modulated wave.

To solve the above-mentioned problem, a transmitter of a first aspect of the invention is provided with: modulated signal generating means for generating a modulated signal; amplitude extracting means for extracting an amplitude component from the modulated signal generated by the modulated signal generating means; amplitude amplifying means having a feedback circuit and for amplifying the amplitude component extracted by the amplitude extracting means; voltage converting means for voltage-converting the amplitude component amplified by the amplitude amplifying means; control means for outputting a control signal according to a signal related to a level of the amplitude component of the modulated signal generated by the modulated signal generating means; voltage adjusting means for outputting the amplitude component voltage-converted by the voltage converting means which amplitude component is changed by the control signal from the control means; and a radio-frequency power amplifier where the modulated signal is inputted to a radio-frequency modulated signal input terminal, the amplitude component outputted from the voltage adjusting means is inputted to a supply voltage terminal, and a modulated wave is outputted as a result. Of the amplitude component returning from an output terminal of the radio-frequency power amplifier to the amplitude amplifying means through the voltage adjusting means and the feedback circuit, a high frequency component that affects a characteristic of a closed loop by the feedback circuit of the amplitude amplifying means is suppressed by the voltage adjusting means according to the control signal.

According to this structure, since of the amplitude component returning from the supply voltage terminal of the radio-frequency power amplifier to the amplitude amplifying means through the voltage adjusting means and the feedback circuit, the high frequency component that affects the characteristic of the closed loop by the feedback circuit of the amplitude amplifying means is suppressed by the voltage adjusting means according to the control signal, the amount of isolation by the voltage adjusting means between the output terminal of the radio-frequency power amplifier and the amplitude amplifying means having the feedback circuit can be changed.

For this reason, in an amplitude component with a high PAPR and high instantaneous peak power, by increasing the amount of isolation by the voltage adjusting means, the level that the amplified amplitude component of the radio-frequency modulated wave inputted from the radio-frequency modulated signal input terminal of the radio-frequency power amplifier and occurring at the radio-frequency output terminal is inputted to the feedback circuit of the amplitude amplifying means through the supply voltage terminal can be attenuated. Consequently, the unnecessary transient response caused in the closed loop structure of the amplitude amplifying means can be reduced. As a result, the distortion component caused from an oscillation of the amplitude component can be reduced in the output of the radio-frequency power amplifier.

Moreover, at the average voltage level of the amplitude component where no instantaneous power fluctuation occurs and the unnecessary transient response is not caused in the closed loop structure of the amplitude amplifying means, by decreasing the amount of isolation by the voltage adjusting means, the power loss consumed by the voltage adjusting means can be reduced.

Consequently, a transmitter can be realized that uses an EER method where no distortion occurs in the output waveform without the efficiency being degraded.

Here, as the signal related to the level of the amplitude component of the modulated signal generated by the modulated signal generating means, for example, the amplitude component extracted by the amplitude extracting means is used.

According to this structure, the amplitude component voltage-converted by the voltage converting means can be outputted in a condition of being changed according to the voltage level of the amplitude component extracted by the amplitude extracting means. That is, the amount of isolation by the voltage adjusting means between the output terminal of the radio-frequency power amplifier and the amplitude amplifying means having the feedback circuit can be changed according to the voltage level of the amplitude component extracted by the amplitude extracting means.

A transmitter of a second aspect of the invention is different from that of the first aspect of the invention in that as the signal related to the level of the amplitude component of the modulated signal generated by the modulated signal generating means, at least one predetermined power level control signal for specifying a power level of the modulated signal generated by the modulated signal generating means or at least one predetermined data rate control signal for specifying a data rate of the modulated signal generated by the modulated signal generating means is used.

According to this structure, a structure is adopted that changes the amount of isolation by the voltage adjusting means according to at least one predetermined power level control signal or at least one predetermined data rate control signal of the modulated signal controlled and outputted by the modulated signal generating means.

For this reason, in a power level setting or a data rate setting where an amplitude component with a high PAPR and high instantaneous peak power occurs, by increasing the amount of isolation of the voltage adjusting means, the level that the amplified amplitude component of the radio-frequency modulated wave inputted from the radio-frequency modulated signal input terminal of the radio-frequency power amplifier and occurring at the radio-frequency output terminal is inputted to the feedback circuit of the amplitude amplifying means through the supply voltage terminal can be attenuated. Consequently, the unnecessary transient response caused in the closed loop structure of the amplitude amplifying means can be reduced. As a result, the distortion component caused from an oscillation of the amplitude component can be reduced in the output of the radio-frequency power amplifier.

Moreover, in a power level setting or a data rate setting where no instantaneous power fluctuation occurs and the unnecessary transient response is not caused in the closed loop structure of the amplitude amplifying means, by decreasing the amount of isolation of the voltage adjusting means, the power loss consumed by the voltage adjusting means can be reduced.

Consequently, a transmitter can be realized that uses an EER method where no distortion occurs in the output waveform without the efficiency being degraded.

Moreover, in the structure of the first aspect of the invention, for example, when the voltage adjusting means is controlled according to the level of the amplitude component extracted by the amplitude extracting means, a control operation, requiring quick response, according to the level of the amplitude component occurs, so that power consumption involved in the control operation (for example, a switching control operation) occurs. However, according to the second aspect of the invention, since such a control operation requiring quick response does not occur, power consumption can be suppressed.

Moreover, since the control condition of the voltage adjusting means can be set before the amplitude component is outputted, unnecessary amplitude component fluctuations caused by controlling the voltage adjusting means are not superimposed on the amplitude component. For this reason, the distortion component occurring in the output of the radio-frequency power amplifier comprising, for example, a saturated amplifier can be reduced.

In the structures of the first and second aspects of the invention, it is preferable that the voltage adjusting means be provided with: a switching circuit for short-circuiting the voltage converting means and the supply voltage terminal of the radio-frequency power amplifier; and a buffer circuit provided between the voltage converting means and the supply voltage terminal of the radio-frequency power amplifier and either of the circuits be selectively operated by the control signal from the control means.

According to this structure, since it is necessary only to switch between the two circuits instead of continuously changing the amount of isolation from the supply voltage terminal of the radio-frequency power amplifier to the voltage converting means for the amplitude component, the structure can be simplified. In this structure, the amount of isolation changes over the entire frequency band.

Moreover, at the average voltage level of the amplitude component where the unnecessary transient response is not caused in the closed loop structure of the amplitude amplifying means, the voltage converting means and the supply voltage terminal of the radio-frequency power amplifier can be short-circuited by the switching circuit. Consequently, the influence of the characteristic variation of the voltage adjusting means on the amplitude component can be minimized.

In the structures of the first and second aspects of the invention, a structure may be adopted such that the voltage adjusting means comprises a frequency characteristic adjustment circuit and a frequency characteristic of an output terminal of the voltage adjusting means is changed by the control signal from the control means.

According to this structure, in the amplitude component supplied from the voltage converting means to the radio-frequency power amplifier, the frequency components other than the necessary amplitude component band is attenuated, so that the distortion of the output waveform can be further reduced. According to this embodiment, isolation does not change in the principal frequency band of the amplitude component, and isolation is ensured only by the high frequency components which are a cause of distortion.

Moreover, by using an inductance for the frequency characteristic adjustment circuit and by the frequency characteristic adjustment circuit having a low-pass filter structure, the frequency characteristic adjustment circuit can serve also as a radio-frequency choke coil that supplies power to the radio-frequency power amplifier. Consequently, the structure of the transmitter can be simplified.

In the structures of the first and second aspects of the invention, a structure may be adopted such that the voltage adjusting means comprises an impedance adjustment circuit and an output terminal impedance of the voltage adjusting means is changed by a switching control signal from switching control means. By this, the amount of isolation of the amplitude component in the entire band can be adjusted.

According to this structure, when the amplitude component is large, the output terminal impedance is fluctuated from the optimum load to the output impedance where the amount of isolation is large to thereby reduce the distortion of the output waveform although the efficiency is degraded, whereas when the amplitude component is small, that is, the output power is low, the output terminal impedance is fluctuated so that the load of the radio-frequency power amplifier is optimum to thereby reduce the degradation in the efficiency of the radio-frequency power amplifier.

Moreover, since the load condition of the output of the radio-frequency power amplifier can be optimized by the level of the amplitude component, even when the load point of the radio-frequency power amplifier changes by the level of the supplied amplitude component, the saturated amplifier can be highly efficiently optimized.

Moreover, in the transmitters of the first and second aspects of the invention, it is preferable that the voltage adjusting means have an emitter follower structure of a bipolar transistor.

According to this structure, since the amplitude component is converted to a voltage that is lower by a constant voltage level (for example, 0.7 V) of the emitter-base voltage determined by the built-in potential of the p-n junction, the fluctuations in the amplitude component can be reduced.

In the transmitters of the first and second aspects of the invention, as the device that is not packaged, for example, the radio-frequency power amplifier which is at least an MMIC (microwave monolithic IC) and the voltage adjusting means which is a silicon IC may be integrated on the same board as an integrated functional device (module structure), that is, as a radio-frequency power amplifier module.

According to this structure, compared to when parts of the voltage adjusting means and the radio-frequency power amplifier that are packaged are separately mounted on a board as parts forming a transmitter, the IC device-to-IC device distance between the voltage adjusting means and the radio-frequency power amplifier can be reduced. Consequently, a group delay of the amplitude component can be reduced that is caused by the capacitance attributed to a stray capacitance caused on the board and part terminals or packaging.

BRIEF DESCRIPTION OF THE DRAWINGS

FIG. 1 is a block diagram showing the structure of a transmitter according to a first embodiment of the present invention;

DESCRIPTION OF THE PREFERRED EMBODIMENTS

First Embodiment

Figure 2A:
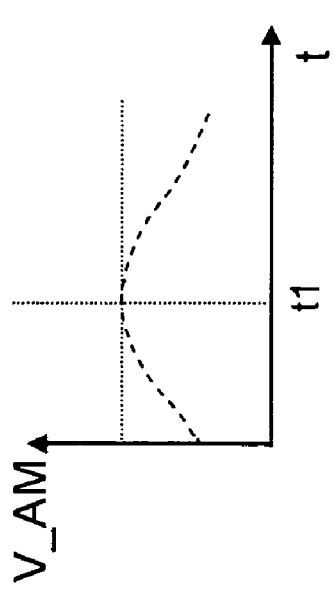
FIG. 2A is a graph showing the time characteristic of an amplitude component voltage V_AM of the output of an amplitude extraction circuit 101 in the transmitter according to the first embodiment of the present invention ($\tau<<t\_delay$, a voltage adjustment circuit is fixed)

A first embodiment of the present invention will be described with reference to the drawings. The embodiment of the present invention will be described with an IEEE 802.11a wireless LAN system as an example.

FIG. 1 is a block diagram of a transmitter according to the first embodiment of the present invention realizing a transmitter using an EER method.

This transmitter comprises, as shown in FIG. 1, an OFDM signal generation circuit 100, an amplitude extraction circuit 101, an amplitude amplification circuit 102, a supply voltage portion 105, an emitter follower 106, a voltage adjustment circuit 107, a switching control circuit 110, a quadrature modulation circuit 111 and a radio-frequency power amplifier 112.

The OFDM signal generation circuit 100 generates an OFDM-modulated signal, and corresponds to the modulated signal generating means.

The amplitude amplification circuit 102 comprises, for example, an operational amplifier 103 and a feedback circuit 104, and has a closed loop structure by negatively feeding back the amplitude component of the output of the emitter follower 106.

The emitter follower 106 is necessary for driving the DC current of the supply voltage supplied to the radio-frequency power amplifier 112, and corresponds to the voltage converting means for voltage-converting the amplitude component of the OFDM signal.

The voltage adjustment circuit 107 comprises, for example, a switching circuit 108 and a buffer circuit 109, and is controlled by the switching control circuit 110.

Next, the operation in the above-described embodiment will be described.

In FIG. 1, the OFDM signal which is a modulated signal is generated by the OFDM signal generation circuit 100 which is means for generating it, and is divided into two branches and outputted as an I (in-phase) signal and a Q (quadrature) signal. The quadrature modulation circuit 111 multiplies the inputted I and Q signals by a carrier wave, upconverts them into desired radio-frequency modulated signals, and inputs them to the radio-frequency modulated signal input terminal of the radio-frequency power amplifier 112.

The I and Q signals which are divided are also inputted to the amplitude extraction circuit 101. The amplitude components extracted by the amplitude extraction circuit 101 are inputted to the operational amplifier 103 and the switching control circuit 110.

The operational amplifier 103 has a closed loop structure where the amplitude component of the output of the emitter follower 106 is negatively fed back through the feedback circuit 104. The operational amplifier 103 amplifies the inputted amplitude component by the gain preset at the feedback circuit 104, and inputs a DC current necessary for driving the radio-frequency power amplifier 112 from the supply voltage portion 105 to the voltage adjustment circuit 107 through the emitter follower 106.

The voltage adjustment circuit 107 comprises, for example, the switching circuit 108 and the buffer circuit 109. Then, at the switching control circuit 110, the level of the amplitude component of the output of the inputted amplitude extraction circuit 101 is compared with the preset reference amplitude level, and a switching control signal is generated in accordance with the result of the comparison. Then, the switching to the circuit to be operated is performed in accordance with the switching control signal. That is, whether the switching circuit 108 is brought into conduction or the buffer circuit 109 is brought into the operating state is switched in accordance with the switching control signal.

The radio-frequency power amplifier 112 operates as a saturated amplifier. For this reason, the modulated wave inputted through the radio-frequency modulated signal input terminal occurs at the output terminal as a modulated wave containing only a phase component with the amplitude component being attenuated. However, by again supplying the amplitude components of the output of the voltage adjustment circuit 107 to the supply voltage terminal and multiplying them together, an OFDM modulated wave provided with correct phase and amplitude components is obtained.

A concrete example will be described in which the voltage adjustment circuit 107 is switched by the switching control signal of the switching control circuit 110 in the above-described embodiment.

In FIG. 1, a first amplitude component of the output of the amplitude extraction circuit 101 is V_AM, and a second amplitude component of the radio-frequency modulated wave inputted from the quadrature modulation circuit 111, amplified to desired power by the radio-frequency power amplifier 112 and outputted to the output terminal is V_AM-PA. Further, the amplitude component outputted from the operational amplifier 103 in a closed loop comprising the operational amplifier 103, the feedback circuit 104 and the emitter follower 106 is V_AM-OUT.

The gain of the closed loop circuit adjusted by the feedback circuit 104 is one time, and the saturated gain of the radio-frequency power amplifier 112 is the 1-dB gain compression point. Moreover, it is assumed that there is a delay of a time t_delay as the delay time amount between the amplitude component V_AM inputted to the noninverting input terminal of the operational amplifier and the amplitude component V_AM-PA inputted to the inverting input terminal thereof.

Figure 2B:
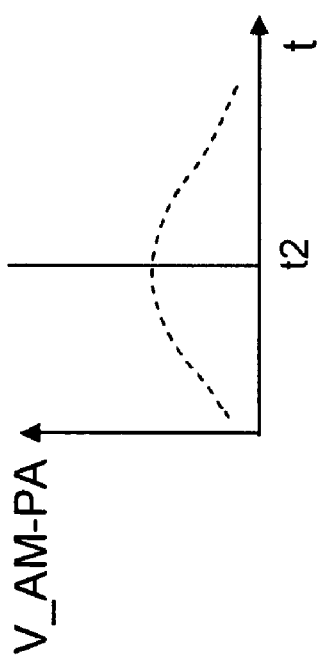
FIG. 2B is a graph showing the time characteristic of an amplitude component voltage V_AM-PA of the output of a radio-frequency power amplifier in the transmitter according to the first embodiment of the present invention ($\tau<<t\_delay$, the voltage adjustment circuit is fixed)
Figure 2C:
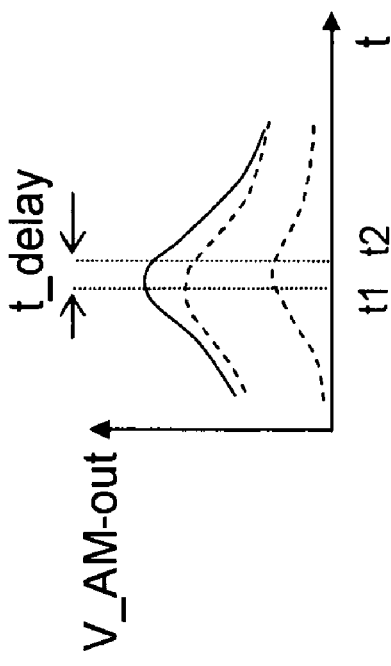
FIG. 2C is a graph showing the time characteristic of an amplitude component voltage V_AM-OUT of the output of an operational amplifier in the transmitter according to the first embodiment of the present invention ($\tau<<t\_delay$, the voltage adjustment circuit is fixed)

FIG. 2A is a graph showing the time characteristic of the amplitude component voltage V_AM of the output of the amplitude extraction circuit 101 in the transmitter ($\tau$<<t_delay, the voltage adjustment circuit 107 is fixed). FIG. 2B is a graph showing the time characteristic of the amplitude component voltage V_AM-PA of the output of the radio-frequency power amplifier 112 in the transmitter ($\tau$<<t_delay, the voltage adjustment circuit 107 is fixed). FIG. 2C is a graph showing the time characteristic of the amplitude component voltage V_AM-OUT of the output of the operational amplifier 103 in the transmitter ($\tau$<<t_delay, the voltage adjustment circuit 107 is fixed).

That is, FIGS. 2A, 2B and 2C are graphs of the amplitude component with respect to time when the data rate of the OFDM modulated signal is low and the convergence time ($\tau$) of the closed loop circuit is sufficiently short compared to the time delay amount (t_delay) between the amplitude components V_AM and V_AM-PA ($\tau$<<t_delay) in the case of a fixed operation in which the voltage adjustment circuit 107 is not controlled and only the switching circuit 108 is brought into conduction (the operation of the buffer circuit 109 is stopped).

In this case, although there is a difference in amplitude component level due to the time delay (t_delay) between the amplitude components V_AM and V_AM-PA, since the response characteristic of the closed loop constituted by the operational loop 103 sufficiently catches up with the time delay (t_delay), the closed loop characteristic converges into the steady state.

Now, why the closed loop characteristic converges into the steady state will be described. When the response characteristic of the closed loop sufficiently catches up with the time delay, in the transient characteristic, the operational amplifier 103 fluctuates the amplitude component V_AM-OUT so as to counteract the influence of the amplitude component V_AM-PM. Consequently, in the steady state, the influence of the amplitude component V_AM-PA is removed, so that the amplitude component V_AM-OUT is an amplitude synchronized with the amplitude component V_AM.

For this reason, as the amplitude component V_AM-OUT of the output waveform of the operational amplifier 103 shown by FIG. 2C, a voltage synchronized with the amplitude component V_AM which is the noninverting terminal input waveform of the operational amplifier 103 and shifted toward the positive side by the Vbe voltage (base-emitter voltage)=0.7 V of the emitter follower 106 is outputted.

Consequently, a waveform equivalent to the amplitude component of the output of the amplitude extraction circuit 101 is supplied to the supply voltage terminal of the radio-frequency power amplifier 112. Consequently, an OFDM modulated wave provided with correct phase and amplitude components is generated and outputted.

Figure 3A:
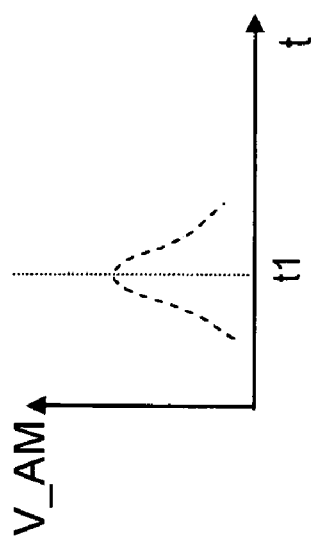
FIG. 3A is a graph showing the time characteristic of the amplitude component voltage V_AM of the output of the amplitude extraction circuit 101 in the transmitter according to the first embodiment of the present invention ($\tau>>t\_delay$, the voltage adjustment circuit is fixed)
Figure 3B:
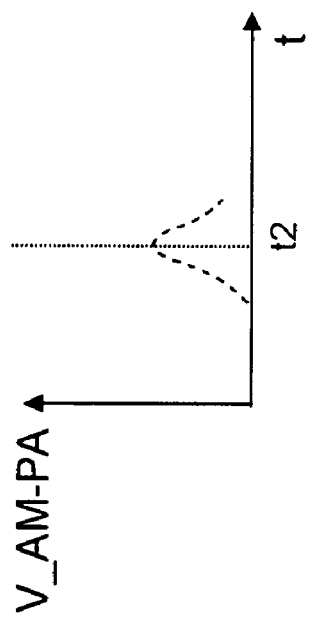
FIG. 3B is a graph showing the time characteristic of the amplitude component voltage V_AM-PA of the output of the radio-frequency power amplifier in the transmitter according to the first embodiment of the present invention ($\tau>>t\_delay$, the voltage adjustment circuit is fixed)
Figure 3C:
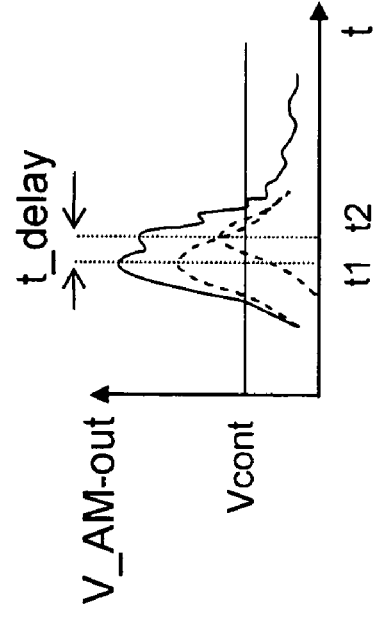
FIG. 3C is a graph showing the time characteristic of the amplitude component voltage V_AM-OUT of the output of the operational amplifier in the transmitter according to the first embodiment of the present invention ($\tau>>t\_delay$, the voltage adjustment circuit is fixed)

FIG. 3A is a graph showing the time characteristic of the amplitude component voltage V_AM of the output of the amplitude extraction circuit 101 in the transmitter ($\tau$>>t_delay, the voltage adjustment circuit 107 is fixed). FIG. 3B is a graph showing the time characteristic of the amplitude component voltage V_AM-PA of the output of the radio-frequency power amplifier 112 in the transmitter ($\tau$>>t_delay, the voltage adjustment circuit 107 is fixed). FIG. 3C is a graph showing the time characteristic of the amplitude component voltage V_AM-OUT of the output of the operational amplifier 103 in the transmitter ($\tau$>>t_delay, the voltage adjustment circuit 107 is fixed).

That is, FIGS. 3A, 3B and 3C are graphs of the amplitude component with respect to time when the data rate of the OFDM modulated signal is high and the convergence time ($\tau$) of the closed loop circuit is sufficiently long compared to the time delay amount (t_delay) between the amplitude components V_AM and V_AM-PA ($\tau$>>t_delay) in the case of the fixed operation in which the voltage adjustment circuit 107 is not controlled and only the switching circuit 108 is brought into conduction (the operation of the buffer circuit 109 is stopped).

In this case, since the time delay (t_delay) between the amplitude component V_AM and the amplitude component V_AM-PA is sufficiently short, the characteristic of the closed loop constituted by the operational amplifier 103 is a transient response condition. For this reason, in the amplitude component V_AM-OUT of the output of the operational amplifier 103, ringing is caused by the voltage difference between the amplitude component V_AM of the noninverting terminal input waveform of the operational amplifier 103 and the amplitude component V_AM-PA of the inverting terminal input waveform thereof, and a vibration not proportional to the amplitude component V_AM occurs as shown in FIG. 3C until the steady state is brought about.

Consequently, to the radio-frequency power amplifier 112, a waveform comprising the amplitude component of the output of the amplitude extraction circuit 101 to which ringing is added is supplied to the supply voltage terminal of the radio-frequency power amplifier 112. As a result, a distortion occurs in the OFDM modulated wave outputted from the radio-frequency power amplifier 112.

Figure 4A:
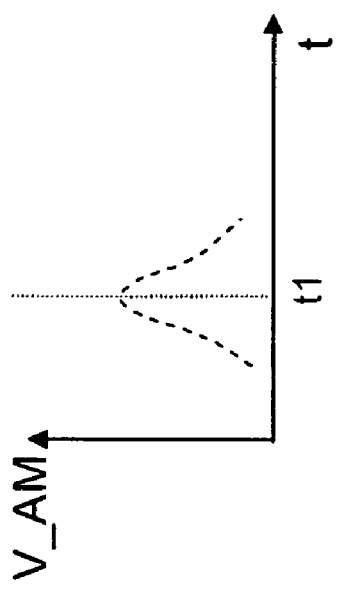
FIG. 4A is a graph showing the time characteristic of the amplitude component voltage V_AM of the output of the amplitude extraction circuit 101 in the transmitter according to the first embodiment of the present invention ($\tau>>t\_delay$, the voltage adjustment circuit is controlled)
Figure 4B:
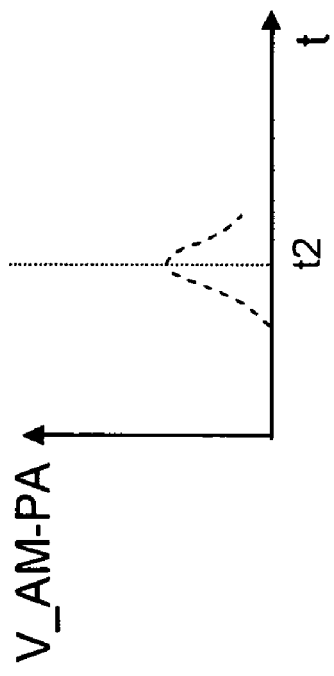
FIG. 4B is a graph showing the time characteristic of the amplitude component voltage V_AM-PA of the output of the radio-frequency power amplifier in the transmitter according to the first embodiment of the present invention ($\tau>>t\_delay$, the voltage adjustment circuit is controlled)
Figure 4C:
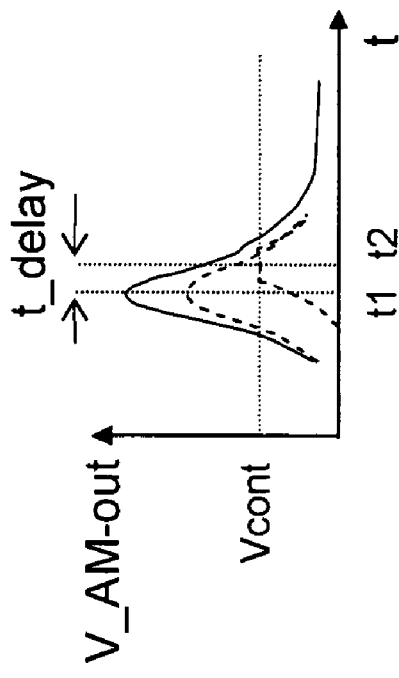
FIG. 4C is a graph showing the time characteristic of the amplitude component voltage V_AM-OUT of the output of the operational amplifier in the transmitter according to the first embodiment of the present invention ($\tau>>t\_delay$, the voltage adjustment circuit is controlled)

On the other hand, FIG. 4A is a graph showing the time characteristic of the amplitude component voltage V_AM of the output of the amplitude extraction circuit 101 in the transmitter ($\tau$>>t_delay, the voltage adjustment circuit 107 is controlled). FIG. 4B is a graph showing the time characteristic of the amplitude component voltage V_AM-PA of the output of the radio-frequency power amplifier 112 in the transmitter ($\tau$>>t_delay, the voltage adjustment circuit 107 is controlled). FIG. 4C is a graph showing the time characteristic of the amplitude component voltage V_AM-OUT of the output of the operational amplifier 103 in the transmitter ($\tau$>>t_delay, the voltage adjustment circuit 107 is controlled).

That is, FIGS. 4A, 4B and 4C are graphs of the amplitude component with respect to time when the switching control circuit 110 is operated by the level of the amplitude component and the voltage adjustment circuit 107 is switched in order to improve the transient response characteristic described with reference to FIG. 3C.

The switching control circuit 110 compares the level of the amplitude component with a preset reference voltage Vcont. At this time, when the level of the amplitude component is not more than the reference voltage Vcont, the switching circuit 108 is operated, an amplitude component having the same level as the amplitude component of the output of the emitter follower 106 is inputted to the supply voltage terminal of the radio-frequency power amplifier 112, and the amount of isolation of the voltage adjustment circuit 107 is reduced, whereby the power loss being caused is reduced. When the level of the amplitude component is not less than the reference voltage Vcont, the buffer circuit 109 is operated, an amplitude component having the same level as the amplitude component of the output of the emitter follower 106 is inputted to the supply voltage terminal of the radio-frequency power amplifier 112, and the amount of isolation of the voltage adjustment circuit 107 is increased, whereby the amplitude component returning from the supply voltage terminal of the radio-frequency power amplifier 112 to the output terminal of the emitter follower 106 by way of the buffer circuit 109 is reduced. By doing this, the transient response caused by the closed loop response of the operational amplifier is improved. In the structure where the signal is passed through the buffer circuit 109, compared to the structure where the signal is passed through the switching circuit 108, since the amount of isolation is large, the power loss being caused at the buffer circuit 109 is large.

For this reason, as shown in FIG. 4C, when the level of the amplitude component is not less than the reference voltage Vcont, the level of the amplitude component V_AM-PA inputted to the closed loop constituted by the operational amplifier 103 is attenuated in accordance with the amount of isolation of the buffer circuit 109, and the closed loop characteristic maintains the steady state where no ringing is caused.

Consequently, a waveform comprising only the amplitude component of the output of the amplitude extraction circuit 101 which component is amplified is supplied to the supply voltage terminal of the radio-frequency power amplifier 112. As a result, an OFDM modulated wave provided with correct phase and amplitude components is generated and outputted.

In order that no transient response characteristic be caused in the characteristic of the closed loop constituted by the operational amplifier 103, a similar result is obtained when the voltage adjustment circuit 107 comprise only the buffer circuit 109. However, generally, the insertion loss is large in the buffer circuit 109 compared to the switching circuit 108. For this reason, as shown in the present embodiment, switching is made between the switching circuit 108 and the buffer circuit 109 by the switching control circuit 110. By doing this, the insertion loss of the voltage adjustment circuit 107 when the time average is performed is reduced, so that high efficiency is attained.

Figure 5:
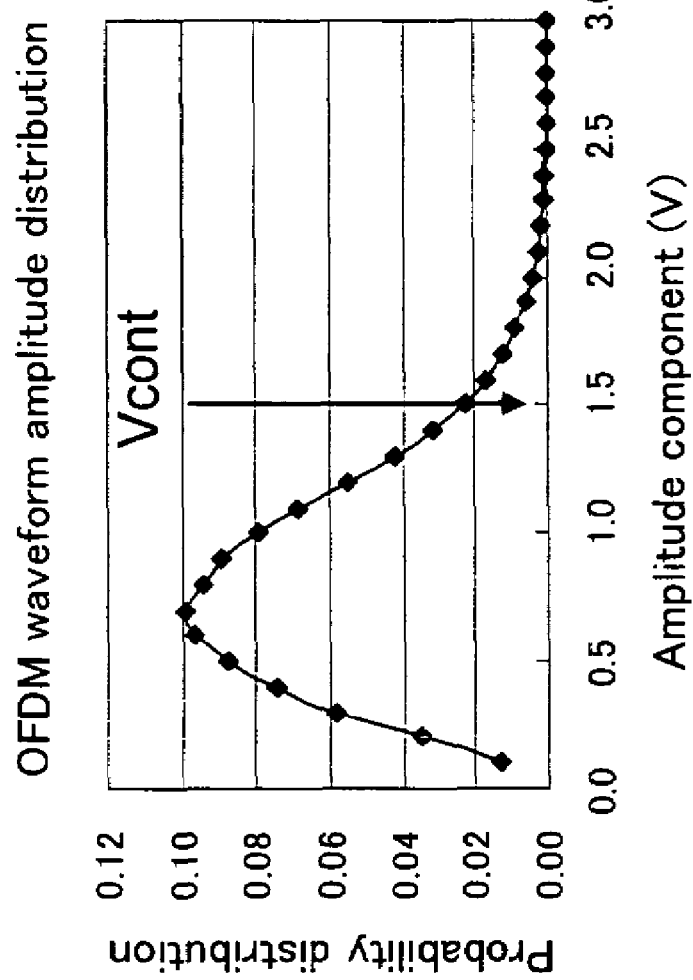
FIG. 5 is a graph showing the OFDM waveform amplitude distribution of 64QAM with respect to the amplitude component up to a peak voltage of 3 V.

FIG. 5 shows the probability distribution with respect to the amplitude component of the OFDM modulated signal at the time of typical 64QAM. The efficiency when the peak voltage of the OFDM signal is 3 V will be concretely described with reference to FIG. 5.

In FIG. 5, the peak factor of the OFDM modulated signal at the time of 64QAM is approximately 10 dB, and when the reference voltage of the switching control circuit 110 is set, for example, to a level half the peak voltage (Vcont=1.5 V), the probability distribution where the amplitude component is not less than 1.5 V corresponds to approximately 3.6%.

For this reason, when it is assumed that the system efficiency in a case where only the switching circuit 108 is used is 50% and the system efficiency in a case where only the buffer circuit 109 is used is 25% irrespective of the voltage level of the amplitude component, the system efficiency in a case where the switching control circuit 110 performs switching control so that the switching circuit 108 is used when the level of the amplitude component is not more than 1.5 V and the buffer circuit 109 is used when the amplitude component is more than 1.5 V is calculated as

50%×0.964+25%×0.036=49.1%

Since the efficiency when only the buffer circuit 109 is used is 25%, this is a significant improvement of efficiency.

While the voltage adjustment circuit 107 switches between two circuits having different amounts of isolation in the present embodiment, the system efficiency can be further improved by the voltage adjustment circuit 107 switching among a plurality of circuits having different amounts of isolation or continuously changing the amount of isolation.

Figure 6:
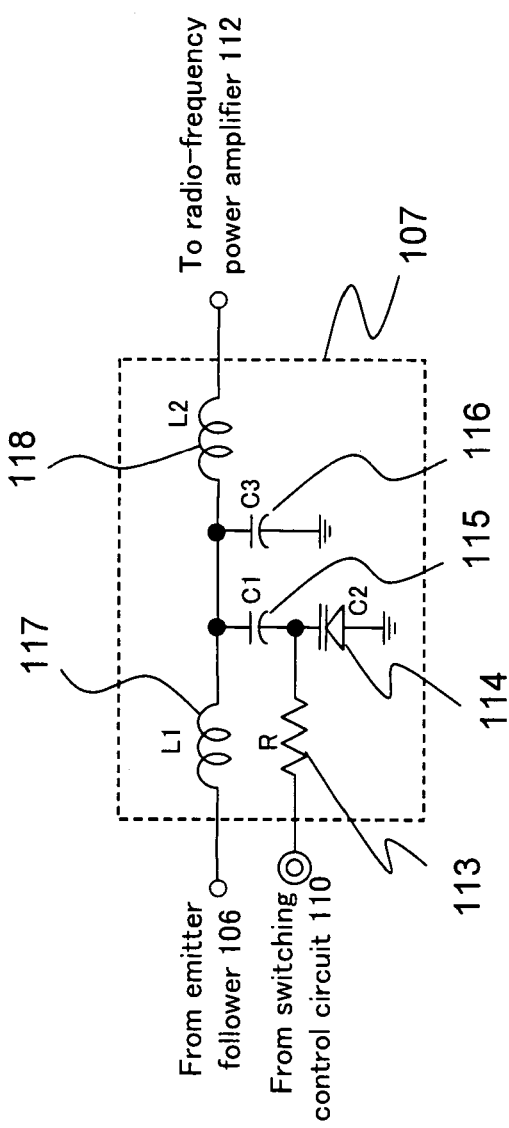
FIG. 6A is a circuit diagram showing the concrete circuit structure when the voltage adjustment circuit is a frequency characteristic adjustment circuit.
FIG. 6B is a graph showing the concrete frequency characteristic when the voltage adjustment circuit is a frequency characteristic adjustment circuit.

Moreover, while a structure that changes the amount of isolation is adopted as the voltage adjustment circuit in the present embodiment, a structure that controls the frequency band may be adopted. FIGS. 6A and 6B show an example in which the structure that controls the frequency band is adopted. FIG. 6A shows a concrete structure of the voltage adjustment circuit 107. FIG. 6B shows the frequency characteristic of the voltage adjustment circuit 107.

In the structure of FIG. 6A, the amplitude component is compared with the reference voltage preset in the switching control circuit 110, and the result is inputted to the voltage adjustment circuit 107 as the switching control signal voltage. The switching control signal voltage is coupled to a variable capacitance device 114 (capacitance value C2) such as a variable capacitance diode through a resistor 113 (resistance value R)

In an amplitude component where the PAPR is high and the instantaneous peak power is high, the capacitance value C2 of the variable capacitance device 114 is increased by the switching control signal voltage, and the pass band of the low-pass filter including an inductor 117 (inductance value L1), a capacitance 115 (capacitance value C1) and the variable capacitance device 114 (capacitance value C2) is changed so as to be reduced, thereby attenuating the high frequency components of the amplitude component. For the high frequency components of the amplitude component, the amount of isolation is increased. For the low frequency components thereof, the amount of isolation is not changed.

In an amplitude component where the PAPR and the instantaneous peak power are not high, the capacitance value C2 of the variable capacitance device 114 is reduced, and the low-pass filter is controlled so that all the frequency components of the amplitude component are passed. Reference numeral 118 represents an inductor (inductance value L2). Reference numeral 116 represents a capacitance (capacitance value C3).

Consequently, in an amplitude component where the PAPR is high and the instantaneous peak power is high, the amplitude component, from the radio-frequency modulated wave of the radio-frequency power amplifier (saturated amplifier) 112, of the modulated signal, in particular, the high frequency components, of the amplitude component, whose influence is large attenuates the level inputted to the feedback circuit 104 of the amplitude amplification circuit 102, so that the unnecessary transient response caused in the closed loop structure of the amplitude amplification circuit 102 can be reduced. Consequently, the distortion component caused from the amplitude component of the output of the radio-frequency power amplifier 112 which is a saturated amplifier can be reduced.

Moreover, even when the control signal from the switching control circuit 110 is not a continuous signal but a switching signal outputting only a plurality of predetermined voltage levels, since the variable capacitance device 114 to be controlled has a low-pass filter structure, the frequency characteristic can be continuously changed, so that an OFDM modulated wave where the distortion is further reduced can be outputted by reducing abrupt fluctuations of the amplitude component.

Moreover, since inductors which are passive devices can be used compared to transistors which are active devices, the loss insertion can be reduced, and higher efficiency can be attained.

Moreover, since the voltage adjustment circuit 107 has a low-pass filter structure using inductors, the following advantage is obtained: While an inductor for cutting a radio-frequency signal is generally necessary when power is supplied to the radio-frequency power amplifier 112, by using the inductor of the voltage adjustment circuit 107 also as the signal cutting inductor, the circuit structure of the radio-frequency power amplifier 112 can be simplified.

Moreover, while a structure that changes the amount of isolation is adopted as the voltage adjustment circuit in the present embodiment, a structure that controls the output terminal impedance of the voltage adjustment circuit may be adopted.

Moreover, while a structure that changes the amount of isolation is adopted as the voltage adjusting means in the present embodiment, a structure that controls the output terminal impedance of the voltage adjustment circuit may be adopted.

Figure 9A:
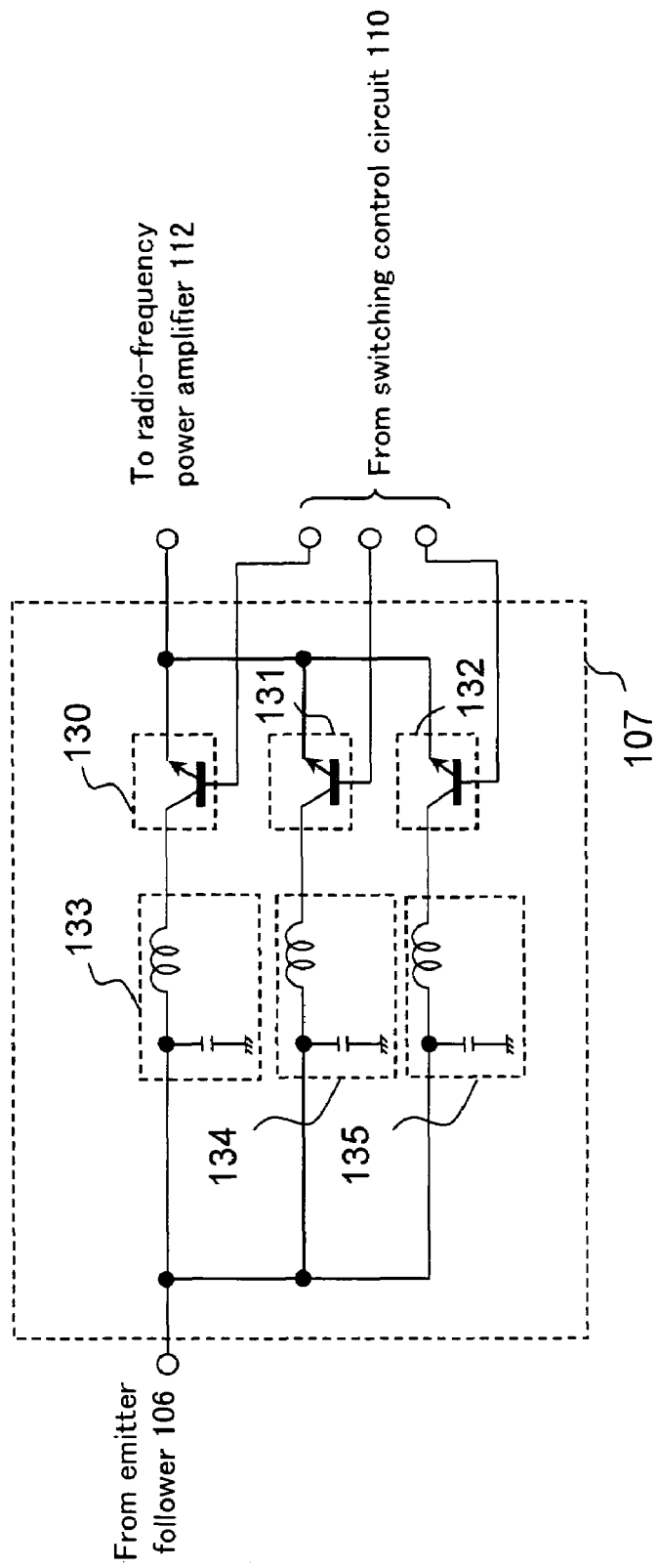
FIG. 9A is a circuit diagram showing a concrete structure of the voltage adjustment circuit 107.
Figure 9C:
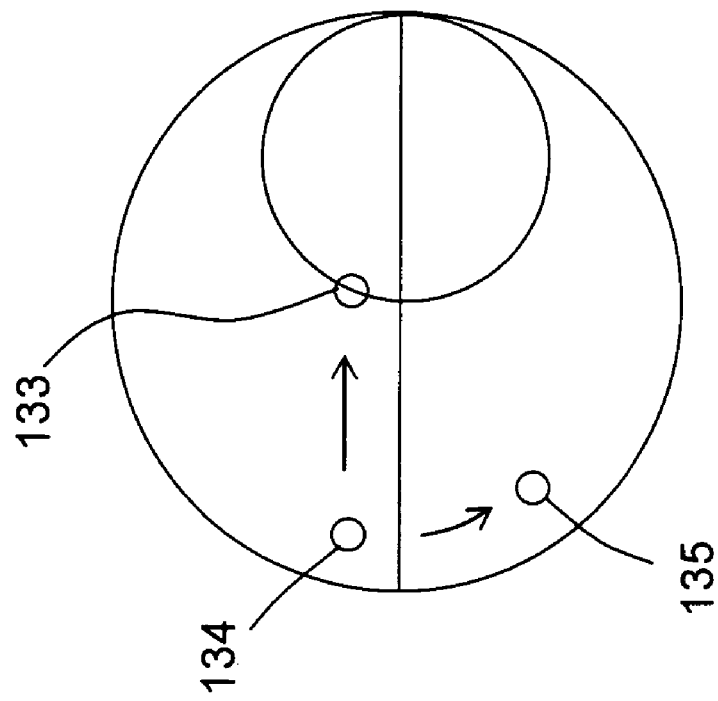
FIG. 9C is a Smith chart showing the output impedance of the voltage adjustment circuit 107.
Figure 9B:
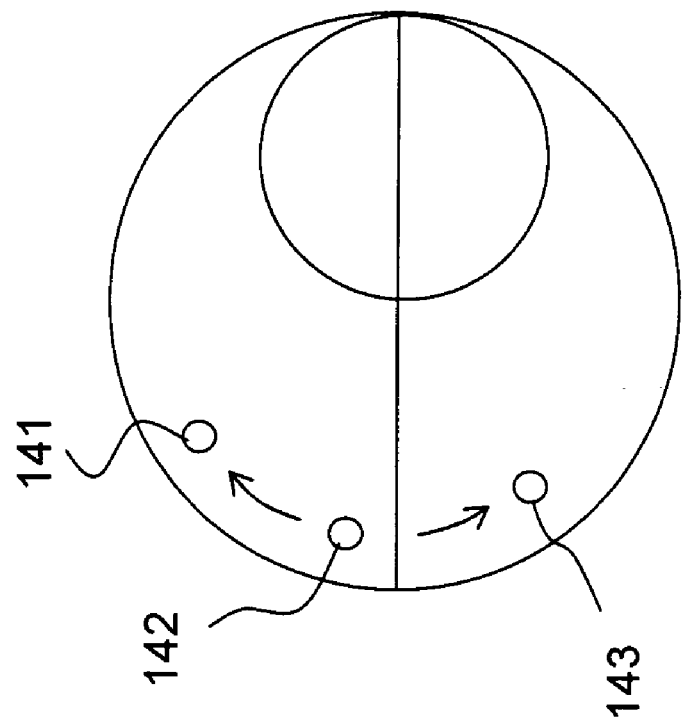
FIG. 9B is a Smith chart showing the optimum load of the radio-frequency power amplifier.

FIGS. 9A, 9B and 9C show an example when the structure that controls the output terminal impedance is adopted. FIG. 9A shows a concrete structure of the voltage adjustment circuit 107. FIG. 9B is a Smith chart showing the optimum load of the radio-frequency power amplifier. FIG. 9C is a Smith chart showing the output impedance of the voltage adjustment circuit 107. In FIG. 9B, reference numeral 141 represents a optimum load point at the time of high power, reference numeral 142 represent a optimum load point at the time of average power, and reference numeral 143 represents a Optimum load point at the time of lower part.

As shown in FIG. 9A, in the switching control circuit 110, the amplitude component is compared with the reference voltage preset in the switching control circuit 110, and the result is inputted to the voltage adjustment circuit 107 as the switching control signal voltage and is supplied to switching circuits 130, 131 and 132.

In normal radio-frequency amplifiers, as shown in FIG. 9B, the optimum output load point changes according to the outputted power. Consequently, when the load of the radio-frequency power amplifier is optimized by the load of the outputted average power, the outputted load is not optimum both when the outputted power is higher than the average power and when it is lower than the average power, so that the efficiency is decreased.

For this reason, as shown in FIGS. 9A and 9B, in an amplitude component with a high PAPR and high instantaneous peak power, by operating the switching circuit 130 by the switching control signal voltage, the load of the radio-frequency amplifier is changed from an output load 133 for the average power to an output load 134 for the high power, thereby converting the load of the radio-frequency amplifier to a high impedance. Consequently, a mismatch of the output load occurs, so that the load of the radio-frequency amplifier is changed to a load that ensures a large amount of isolation.

Moreover, in the case of an amplitude component of the average power, by operating the switching circuit 131 by the switching control signal voltage, the load of the radio-frequency amplifier is the output load 133 for the average power and the load of the radio-frequency power amplifier is optimized. Further, in the case of an amplitude component of the low power, by operating the switching circuit 132 by the switching control signal voltage, the load is changed from the output load 133 for the average power to an output load 135 for the low power. By switching the load in the above-described manner, even when the output load operating point is changed by switching the load, the load of the radio-frequency power amplifier is optimized between the average power load and the low power load.

By doing this, in an amplitude component with a high PAPR and high instantaneous peak power, the level at which the amplitude component from the radio-frequency modulated wave of the radio-frequency power amplifier (saturated amplifier) 112 in the modulated signal is inputted to the feedback circuit 104 of the amplitude amplification means 102 is attenuated, whereby the unnecessary transient response caused in the closed loop structure of the amplitude amplification circuit 102 can be reduced.

Moreover, when the output power is low, since the load is switched so that the load of the radio-frequency power amplifier is optimum, the degradation in the efficiency of the radio-frequency power amplifier can be reduced.

The function of the voltage adjustment circuit will be described.

(1) In the switching and buffer circuits, as the amplitude component inputted from the emitter follower to the supply voltage terminal, an amplitude component of the same level is inputted, and when the amplitude component is large, the amplitude component (V_AM-PA) of the radio-frequency power amplifier output returning from the supply voltage terminal to the emitter follower is reduced by changing the isolation.

(2) In frequency adjustment circuits, when the amplitude component is large, the high frequency components of the amplitude component that affects the closed loop characteristic of the radio-frequency power amplifier output returning to the emitter follower is attenuated. On the other hand, the high frequency components of the amplitude component outputted from the emitter follower to the supply voltage terminal is similarly attenuated. The signal passes through the principal frequency band of the amplitude component without attenuated from both the emitter follower and the supply voltage terminal.

(3) In impedance adjustment circuits, when the amplitude component is large, since the impedance from the emitter follower to the supply voltage terminal is changed including all the pass bands of the amplitude component, the amplitude component is attenuated and outputted to the supply voltage terminal. Likewise, the amplitude component (V_AM-PA) from the supply voltage terminal to the emitter follower is attenuated at the same level.

(4) The above-described structures are collectively expressed as outputting the amplitude component voltage-converted by a voltage conversion circuit which amplitude component is changed.

Second Embodiment

Figure 7:
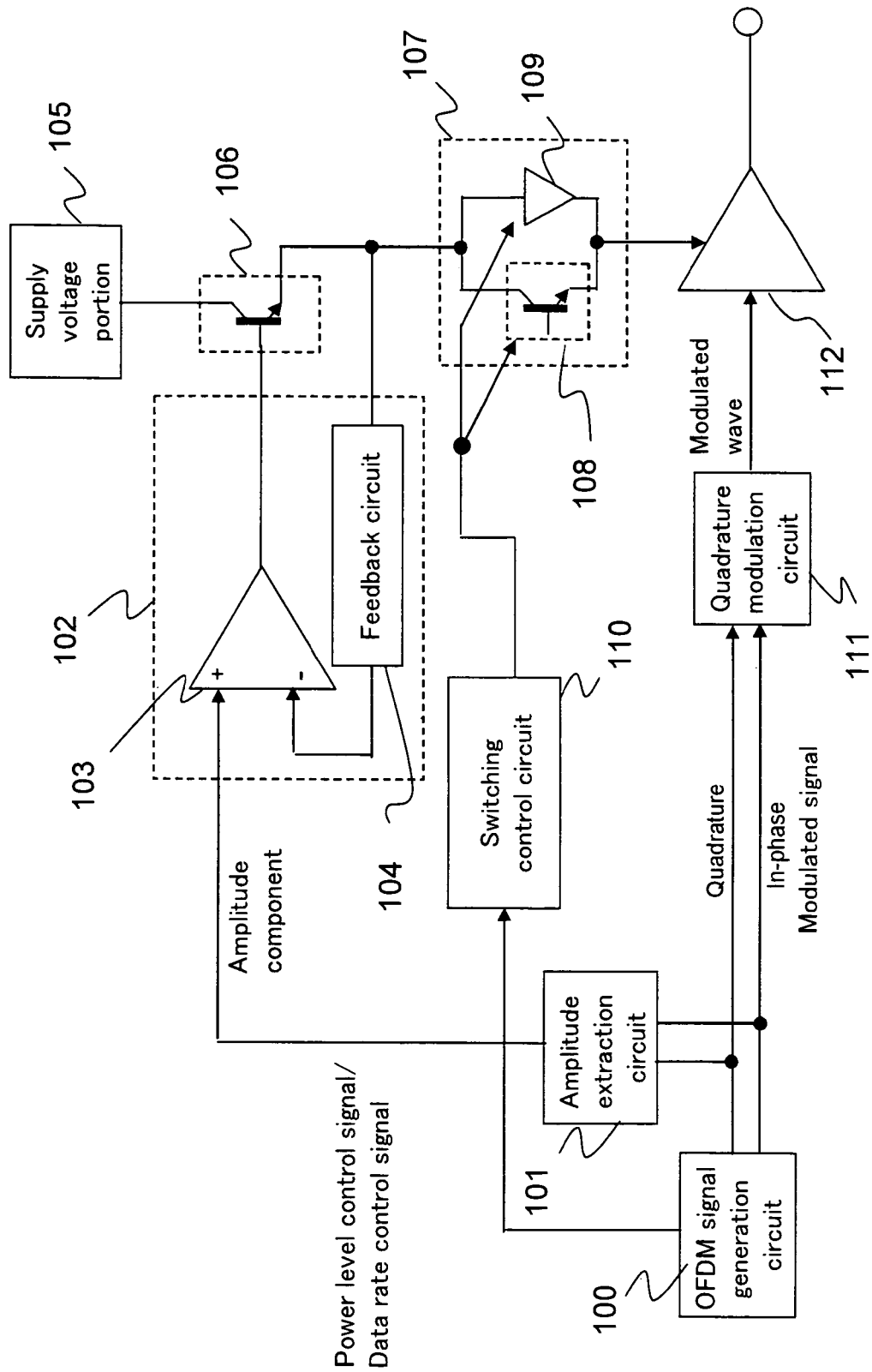
FIG. 7 is a block diagram showing the structure of a transmitter according to a second embodiment of the present invention.
Figure 8:
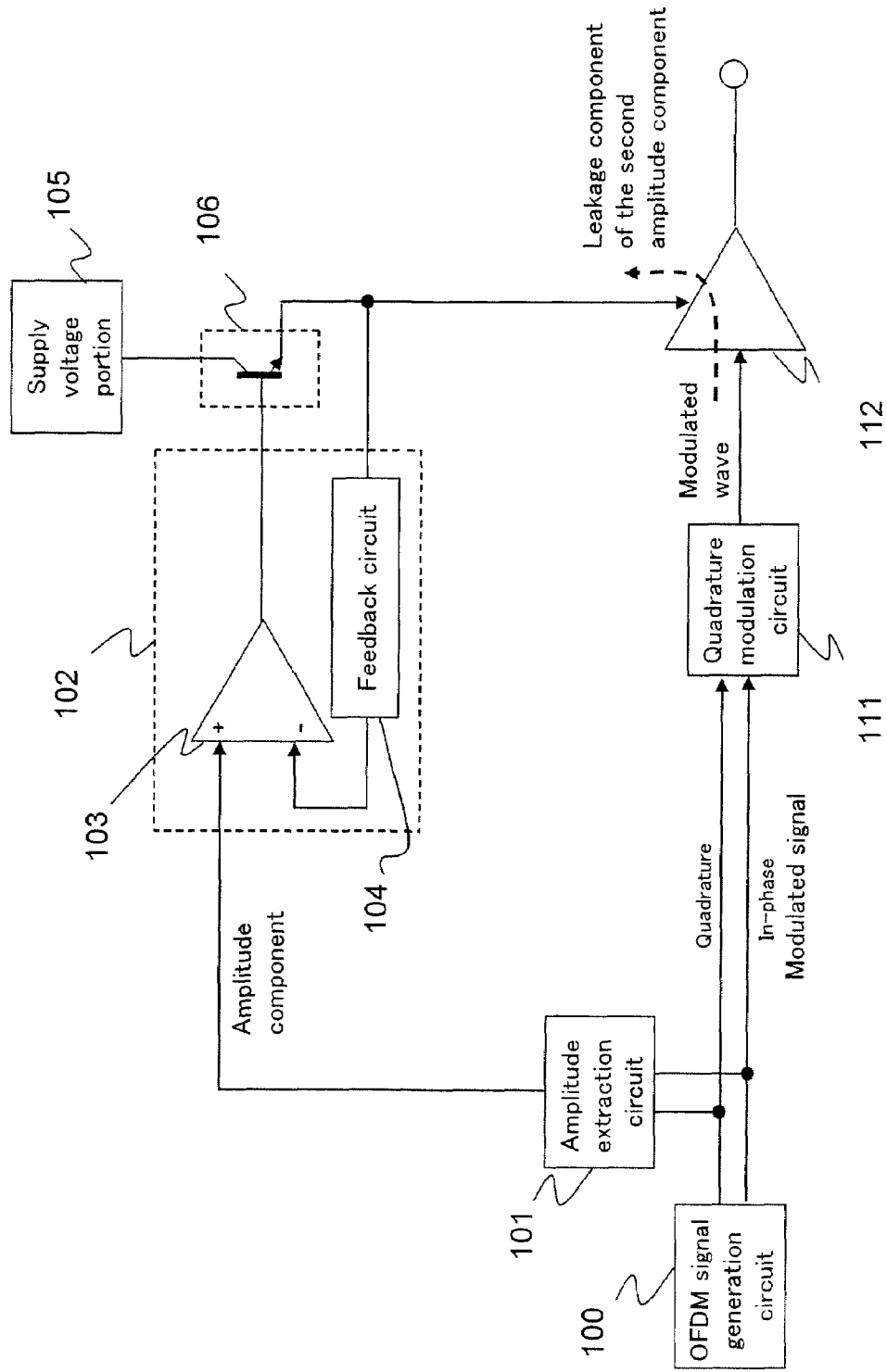
FIG. 8 is a block diagram showing the structure of the conventional transmitter.

FIG. 7 is a block diagram of a transmitter according to a second embodiment of the present invention. In FIG. 7, the same elements as those of FIG. 1 are denoted by the same reference numerals and descriptions thereof are omitted.

This transmitter is different from that of the first embodiment in that as shown in FIG. 7, the switching control circuit 110 performs the switching control of the voltage adjustment circuit 107 not according to the amplitude component but according to at least one predetermined power level control signal for specifying the power level of the OFDM modulated signal or at least one data rate control signal for specifying the data rate of the OFDM modulated signal which control signals are outputted from the OFDM signal generation circuit 100.

The power level control signal and the data rate control signal will be described. In communication systems, in order that the speech quality between communication systems is compensated for so as to be constant between the transmitter and the receiver, the above-mentioned two control signals are specified mainly from a base server (a base station in the case of mobile telephones), and the power level and the data rate of the transmitter (in this case, a handset such as a mobile telephone) are set according to the control signal specification.

(1) When high power is always transmitted by a transmitter, power consumption is large. For this reason, the power level is controlled according to the signal (power level control signal) specified by the receiver so that the transmitted power is reduced when the transmitter-receiver distance is short and the transmitted power is increased when the distance is increased to degrade the quality of the received speed. Normally, there are several power levels, and the transmitter transmits the output power just at the power level specified by the receiver.

(2) When the data rate is increased, the frequency band of the amplitude component is increased, abrupt time fluctuations of the amplitude component are increased, and a distortion occurs in the radio-frequency power amplifier, which leads to a distortion in the modulated wave and a degradation in modulation accuracy. For this reason, the data rate is controlled according to the signal (data rate control signal) specified by the receiver so that when the amount of transmitted data is small, the data rate at which the transmitter transmits the data is normally minimized in accordance with the amount.

From the above, normally, the data rate of the modulated signal and the output power level outputted by the radio-frequency power amplifier are controlled by the control signal (specified by the receiver) from the CPU controlling the transmitter. In this specification, the OFDM signal generation circuit 100 includes the function.

According to this structure, when the data rate of the outputted OFDM modulated signal is low, or when no transient response characteristic is caused in the characteristic of the closed loop constituted by the operational amplifier 103 and no distortion component is caused in the OFDM modulated wave outputted from the radio-frequency power amplifier 112 when the power level is low, the switching control circuit 110 controls the voltage adjustment circuit 107 so as to reduce the amount of isolation and reduce the insertion loss irrespective of the level of the amplitude component.

On the other hand, when the data rate is high, or when a transient response is caused in the characteristic of the closed loop constituted by the operational amplifier 103 and a distortion component is caused in the OFDM modulated waveform outputted from the radio-frequency power amplifier 112 when the power level is high, the switching control circuit 110 controls the voltage adjustment circuit 107 so as to ensure isolation although an insertion loss is present irrespective of the level of the amplitude component.

Consequently, in a transmitter highly frequently used mainly when the data rate of the OFDM modulated signal is low or under a condition where the power level is low, the time during which the voltage adjustment circuit 107 is used with a low loss is longer than in the transmitter structured in the first embodiment, so that higher efficiency can be attained.

Moreover, by previously fixing the control condition of the voltage adjustment circuit 107 before outputting the OFDM modulated signal, the transient response characteristic caused when the voltage adjustment circuit 107 is controlled is not caused in the amplitude component. Consequently, an OFDM modulated signal with a reduced distortion component can be outputted.

Moreover, it is unnecessary to operate the switching control circuit 110 in accordance with the amplitude component with a high PAPR and high instantaneous peak power. As a result, the structured circuit can be simplified.

Moreover, in the transmitters, as the device that is not packaged, for example, the radio-frequency power amplifier which is at least an MMIC (microwave monolithic IC) and the voltage adjusting means which is a silicon IC may be integrated on the same board as an integrated functional device (module structure), that is, as a radio-frequency power amplifier module.

According to this structure, compared to when parts of the voltage adjusting means and the radio-frequency power amplifier that are packaged are separately mounted on a board as parts forming a transmitter, the IC device-to-IC device distance between the voltage adjusting means and the radio-frequency power amplifier can be reduced. Consequently, a group delay of the amplitude component can be reduced that is caused by the capacitance attributed to a stray capacitance caused on the board and part terminals or packaging.

INDUSTRIAL APPLICABILITY

The transmitter according to the present invention produces an effect that a transmitter using an EER method where no transient response is caused and no distortion occurs in the output waveform can be realized in a closed loop structure that supplies, as the supply voltage of the radio-frequency power amplifier, an amplitude component with a high PAPR and large fluctuations in instantaneous peak power, and is adaptable to uses of transmitters including the radio-frequency power amplifier whose supply voltage includes the closed loop structure and is controlled.

What is claimed is:

1. A transmitter comprising:
    modulated signal generating means for generating a modulated signal;
    amplitude extracting means for extracting an amplitude component from the modulated signal generated by the modulated signal generating means;
    amplitude amplifying means having a feedback circuit and for amplifying the amplitude component extracted by the amplitude extracting means;
    voltage converting means for voltage-converting the amplitude component amplified by the amplitude amplifying means;
    control means for outputting a control signal according to a signal related to a level of the amplitude component of the modulated signal generated by the modulated signal generating means;
    voltage adjusting means for outputting the amplitude component voltage-converted by the voltage converting means, said amplitude component being changed by the control signal from the control means; and
    a radio-frequency power amplifier where the modulated signal is inputted to a radio-frequency modulated signal input terminal, the amplitude component outputted from the voltage adjusting means is inputted to a supply voltage terminal, and a modulated wave is outputted as a result,
    wherein of the amplitude component returning from an output terminal of the radio-frequency power amplifier to the amplitude amplifying means through the voltage adjusting means and the feedback circuit, a high frequency component that affects a characteristic of a closed loop by the feedback circuit of the amplitude amplifying means is suppressed by the voltage adjusting means according to the control signal.

2. A transmitter according to claim 1, wherein the signal related to the level of the amplitude component of the modulated signal generated by the modulated signal generating means is the amplitude component extracted by the amplitude extracting means.

3. A transmitter according to claim 1, wherein the signal related to the level of the amplitude component of the modulated signal generated by the modulated signal generating means is at least one predetermined power level control signal for specifying a power level of the modulated signal generated by the modulated signal generating means.

4. A transmitter according to claim 1, wherein the signal related to the level of the amplitude component of the modulated signal generated by the modulated signal generating means is at least one predetermined data rate control signal for specifying a data rate of the modulated signal generated by the modulated signal generating means.

5. A transmitter according to claim 1, wherein a quadrature modulation circuit is provided in an input portion of the radio-frequency power amplifier.

6. A transmitter according to claim 1, wherein the voltage adjusting means comprises: a switching circuit for short-circuiting the voltage converting means and the supply voltage terminal of the radio-frequency power amplifier; and a buffer circuit provided between the voltage converting means and the supply voltage terminal of the radio-frequency power amplifier, and either the switching circuit or the buffer circuit is selectively operated by the control signal from the control means.

7. A transmitter according to claim 1, wherein the voltage adjusting means comprises a frequency characteristic adjustment circuit, and a frequency characteristic transmitted by the voltage adjusting means is changed by the control signal from the control means.

8. A transmitter according to claim 1, wherein the voltage adjusting means comprises an impedance adjustment circuit, and an output impedance of the voltage adjusting means is changed by the control signal from the control means.

9. A transmitter according to claim 1, wherein the voltage adjusting means has an emitter follower structure of a bipolar transistor.

10. A transmitter according to claim 1, wherein at least the radio-frequency power amplifier and the voltage adjusting means are integrated with each other to constitute a radio-frequency power amplifier module.

* * * * *